(12) United States Patent
Vankayala

(10) Patent No.: US 11,094,363 B2
(45) Date of Patent: *Aug. 17, 2021

(54) REDUCED PEAK SELF-REFRESH CURRENT IN A MEMORY DEVICE

(71) Applicant: MICRON TECHNOLOGY, INC., Boise, ID (US)

(72) Inventor: Vijayakrishna J. Vankayala, Allen, TX (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 16/825,759

(22) Filed: Mar. 20, 2020

(65) Prior Publication Data

US 2020/0219557 A1 Jul. 9, 2020

Related U.S. Application Data

(63) Continuation of application No. 16/121,448, filed on Sep. 4, 2018, now Pat. No. 10,622,052.

(51) Int. Cl.
*G06F 12/00* (2006.01)
*G11C 11/406* (2006.01)
*G06F 1/10* (2006.01)
*G06F 3/06* (2006.01)
*G11C 11/409* (2006.01)

(52) U.S. Cl.
CPC ......... *G11C 11/40615* (2013.01); *G06F 1/10* (2013.01); *G06F 3/0619* (2013.01); *G06F 3/0659* (2013.01); *G06F 3/0673* (2013.01); *G11C 11/409* (2013.01)

(58) Field of Classification Search
CPC ............ G11C 11/40615; G11C 11/409; G06F 3/0619; G06F 1/10; G06F 3/0673; G06F 3/0659
USPC .......................................................... 711/106
See application file for complete search history.

(56) References Cited

U.S. PATENT DOCUMENTS

| 5,627,791 | A | 5/1997 | Wright et al. |
| 6,992,943 | B2 | 1/2006 | Hwang et al. |
| 7,701,753 | B2 | 4/2010 | Oh |
| 7,768,859 | B2 | 8/2010 | Oh |
| 8,300,488 | B2 | 10/2012 | Pyeon |
| 2005/0108460 | A1 | 5/2005 | David |

OTHER PUBLICATIONS

Google Search, Oct. 27, 2019, https://www.google.com/search?tbm=pts&source=hp&ei=0ga1XZi-N5Da5gLA4JCoAw&q=first+subset+memory+self-refresh+first+self-refresh+cycle+s . . . , pp. 1-2.

*Primary Examiner* — Mardochee Chery
(74) *Attorney, Agent, or Firm* — Fletcher Yoder, P.C.

(57) ABSTRACT

Devices and methods include organizing memory units of a memory device into a number of groups. The devices and methods also include self-refreshing each group of memory units on different corresponding sequential clock pulses of a self-refresh clock. Specifically, at least one of each group of memory units counts pulses of a self-refresh clock and invokes a self-refresh after every nth pulse of a cycle of pulses while not invoking a self-refresh on all other pulses of the cycle of pulses.

20 Claims, 6 Drawing Sheets

REDUCED PEAK SELF-REFRESH CURRENT IN A MEMORY DEVICE

CROSS-REFERENCE TO RELATED APPLICATIONS

This application is a continuation of U.S. patent application Ser. No. 16/121,448 filed on Sep. 4, 2018, which is incorporated by reference herein in its entirety for all purposes.

BACKGROUND

Field of the Present Disclosure

Embodiments of the present disclosure relate generally to the field of semiconductor devices. More specifically, embodiments of the present disclosure relate to controlling self-refreshes to reduce a peak self-refresh current in memory devices.

Description of Related Art

Semiconductor devices (e.g., dynamic random access memory (DRAM) devices) include memory banks that utilize capacitors to store electrical charges indicative of logical ones and zeros. However, the capacitors slowly leak charge. Thus, without intervention, the data stored in the memory banks may be lost. To prevent data loss due to charge leakage, the memory device may refresh data stored in the memory banks using a memory refresh. During a memory refresh, the data is read from a memory bank and rewritten back to the memory bank.

Embodiments of the present disclosure may be directed to one or more of the problems set forth above.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As previously noted, a dynamic random-access memory (DRAM) device (e.g., a double-data rate type 4 (DDR4) or type 5 (DDR5)) may utilize a memory refresh to refresh capacitors of a memory bank to prevent data loss due to charge leakage by capacitors of the memory bank. Also, as previously noted, the memory refresh of a memory bank includes a read of the memory bank and rewriting the read data back to the memory bank. In some embodiments, a DRAM device may utilize a self-refresh where all banks on a die and/or all banks on all die of a memory device are refreshed without using logic/circuitry outside of the DRAM device (e.g., a host device). In other words, a memory controller within the DRAM device may include circuitry and/or logic to perform a refresh of the memory bank.

Figure 1:
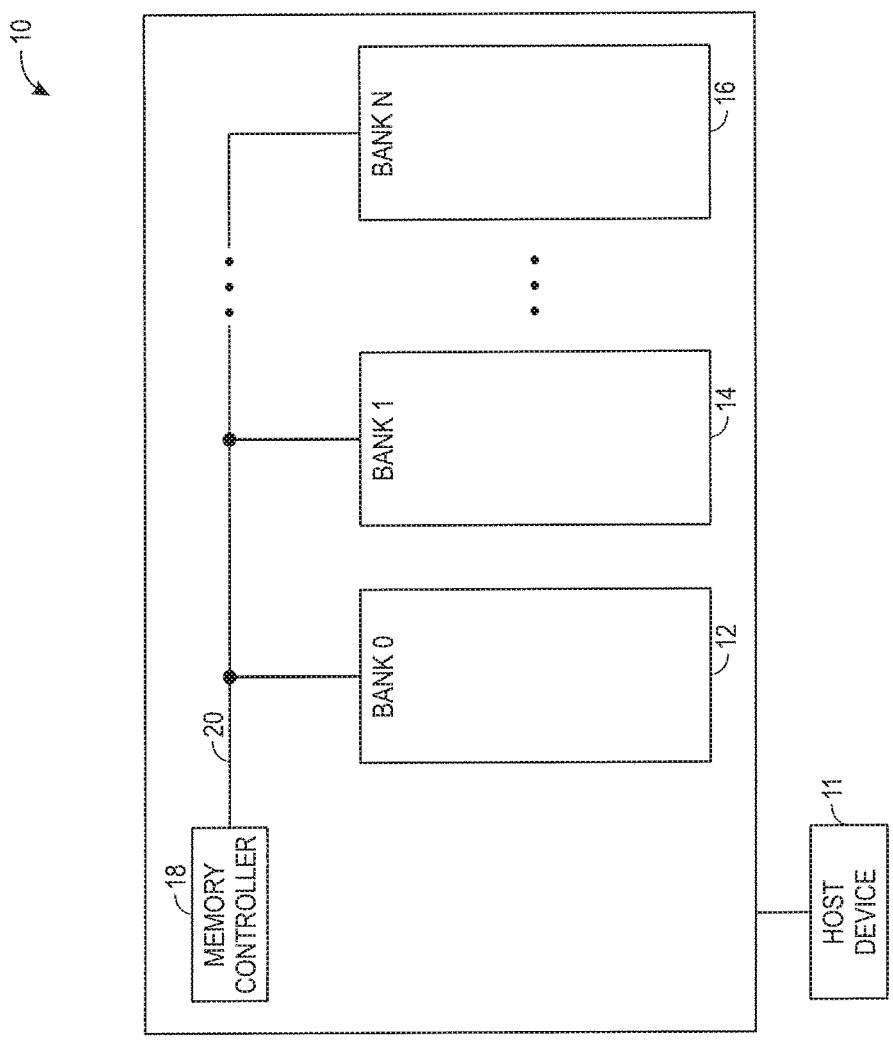
FIG. 1 is a simplified block diagram illustrating certain features of a memory device having multiple memory banks and a memory controller, in accordance with an embodiment.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a DDR4 or DDR5 synchronous DRAM (SDRAM) device. The memory device 10 is coupled to a host device 11 that is used to store data in memory banks 12, 14, and 16.

The memory device 10 may include any number of memory banks 12, 14, and 16. The memory banks 12 may be DDR4 or DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., ×8 or ×16 memory chips), as will be appreciated. Each SDRAM memory chip may include one or more memory banks 12, 14, and 16. The memory device 10 represents a portion of a single memory chip (e.g., SDRAM chip) having a number of memory banks 12, 14, and 16. In some embodiments, the memory banks 12 may be further arranged to form bank groups. For instance, for an 8 gigabyte (Gb) SDRAM, the memory chip may include 16 memory banks, arranged into 8 bank groups, each bank group including 2 memory banks. For a 16 Gb SDRAM, the memory chip may include 32 memory banks, arranged into 8 bank groups, each bank group including 4 memory banks, for instance. Various other configurations, organizations and sizes of the memory banks 12, 14, and 16 on the memory device 10 may be utilized depending on the application and design of the overall system.

The memory device 10 also includes a memory controller 18 that may be used to interact with the memory banks 12, 14, and 16 via one or more buses 20. The memory controller 18 may be used to control access to the memory banks 12, 14, and 16. The memory controller 18 may also be used to refresh the banks 12, 14, and 16 with or without input from the host device 11. In some embodiments, at least a portion of the functionality of the memory controller 18 may be implemented within the memory banks 12, 14, and/or 16. Furthermore, the memory device 10 may include multiple die each having its own set of memory banks 12, 14, and 16.

Figure 2:
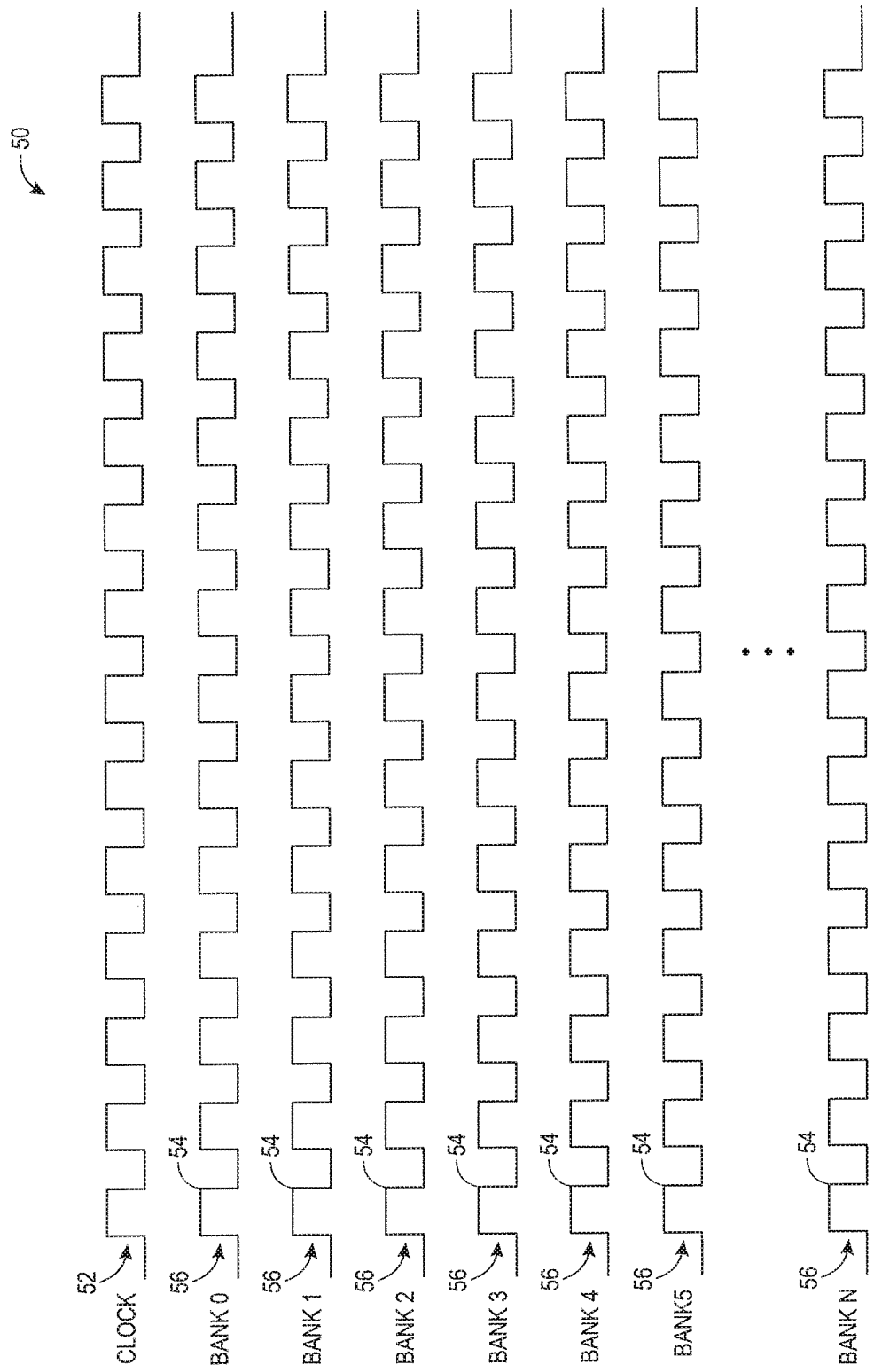
FIG. 2 is a timing diagram of the memory circuitry of FIG. 1 with simultaneous refreshes of the memory banks within a single refresh period, in accordance with an embodiment.

FIG. 2 illustrates a timing diagram 50 that shows a refresh clock 52 that invokes memory refreshes in each memory bank as indicated by memory refreshes 54 of memory bank refresh signals 56. Although FIGS. 2-5 shows a refresh of individual banks, the banks may be illustrative of refreshes of memory banks of one or more die. The refresh clock 52 may be a self-refresh oscillator. Furthermore, the pulses of the refresh clock 52 and the memory refreshes 54 are representations of when the related aspects occur and/or begin. For example, the pulses of the refresh clock 52 may be the same duration or different durations than the memory refreshes 54. Furthermore, in some embodiments, the memory refreshes 54 of different memory banks may have different durations. As illustrated, during a self-refresh illustrated in the timing diagram 50, all memory banks (e.g., banks on a die and/or all banks of all die) of the memory device 10 are refreshed simultaneously. In some embodiments, the refreshes may be substantially simultaneous with a small memory unit stagger (e.g., up to 8 ns) may be inserted to reduce peak current spikes used in the memory refresh. However, as density in the memory device 10 increases (e.g., 16 Gb or 32 Gb), the stack height of the die increases. The increase of the stack height also increases a peak self-refresh current used to refresh all of the banks simultaneously or substantially simultaneously. Due to the increased stack height, the increase peak self-refresh current may exceed a maximum specified current for the memory device 10. Additionally or alternatively, the increased current may also cause array write-back issues when the data is written back to the memory bank 12, 14, and 16 due to the current demand for the write back exceeding an available current for the self-refresh. Furthermore, a refresh timing budget in a specification (e.g., DDR4 and/or DDR5) may specify a maximum refresh duration that may not provide enough leeway to stagger the memory refreshes 54 of memory banks to alleviate peak self-refresh current issues within a single refresh period.

Figure 3:
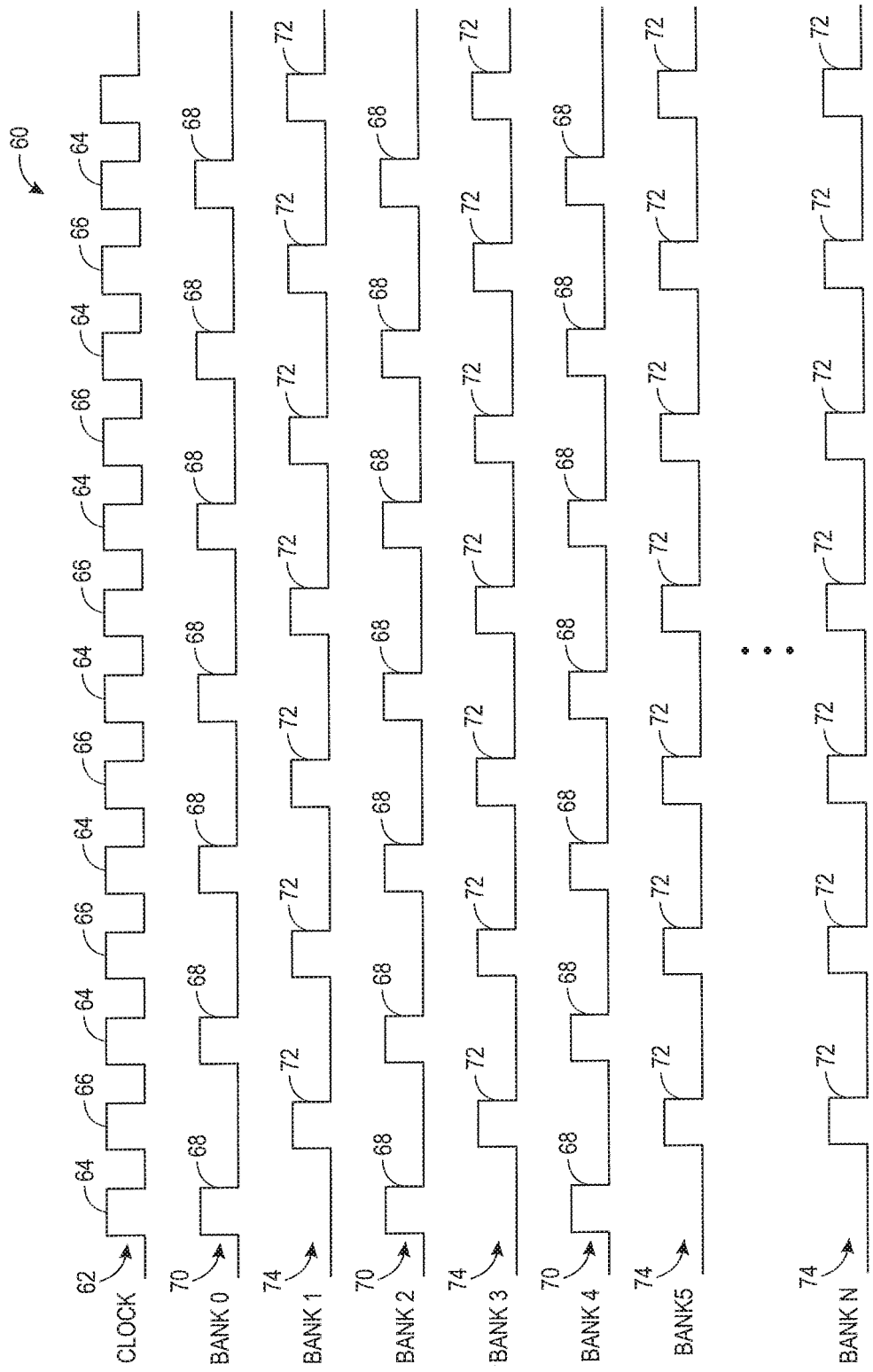
FIG. 3 is a timing diagram of the memory circuitry of FIG. 1 with refreshes of the memory banks within alternating refresh periods, in accordance with an embodiment.

To satisfy the refresh timing budget and reduce the peak self-refresh current, the memory device 10 may include a memory unit stagger of refreshes not within a single refresh cycle but across multiple refresh cycles. In other words, the memory banks 12, 14, and 16 may refresh during refresh cycles. For instance, the memory units (e.g., memory banks 12, 14, and 16 or the die on which the banks are located) may be grouped into odd memory units and even memory units where odd numbered memory units refresh on odd pulses of the self-refresh oscillator and even numbered memory units refresh on even pulses of the self-refresh oscillator. As discussed below, FIG. 3 illustrates a timing diagram 60 indicative of odd and even memory banks that refresh on odd and even pulses of the self-refresh oscillator. In some embodiments, to ensure that the memory banks are still refreshed as frequently as a whole-die-simultaneous refresh, a frequency of the oscillator may double to cause self-refresh cycles to occur twice as frequently with only half of the memory banks refreshing. Reducing the number of memory banks simultaneously refreshing by half also reduces the self-refresh peak current by half.

Turning to FIG. 3, the timing diagram 60 includes a clock 62 that may be used as an oscillator that alternatingly causes the memory banks to refresh. The clock 62 includes alternating pulses 64 and 66, where the pulses 64 cause refreshes in a first set of the memory banks and the pulses 66 cause refreshes in a second set of the memory banks. In some embodiments, the clock 62 may be faster than the clock 52 used for simultaneous refreshes to ensure that each memory bank is still updated frequently enough despite skipping some memory refresh cycles. For instance, the clock 52 may be set at a speed to ensure that each memory bank is updated before the capacitors of the memory banks leak enough charge that logic high values may be not interpreted correctly. In one embodiment, the clock 62 may have a higher (e.g., double) frequency than the clock 52 used for simultaneous refreshes since each memory bank experiences a refresh on every other refresh cycle instead of each refresh cycle to ensure that the refresh rate for each memory bank is maintained despite the alternating refresh pattern.

When one of the first sets of the pulses 64 occur on the clock 62, corresponding memory refreshes 68 occur for a first subset of the memory banks corresponding to lines 70. Similarly, when one of the second sets of the pulses 66 occur on the clock 62, corresponding memory refreshes 72 occur for a second subset of the memory banks corresponding to lines 74. As illustrated, each of the memory refreshes 68 occur simultaneously or substantially simultaneously (with a small 4-8 ns stagger). Similarly, each of the memory refreshes 72 occur simultaneously or substantially simultaneously (with a small 4-8 ns stagger).

Regardless of whether the bank groups are refreshed simultaneously or substantially simultaneously, memory refreshes of the different groups are staggered within the memory banks to offset peak current demand for the bank refreshes by distributing memory refreshes for the different groups over time by interleaving alternating memory refresh cycles of alternating memory bank groups.

Figure 4:
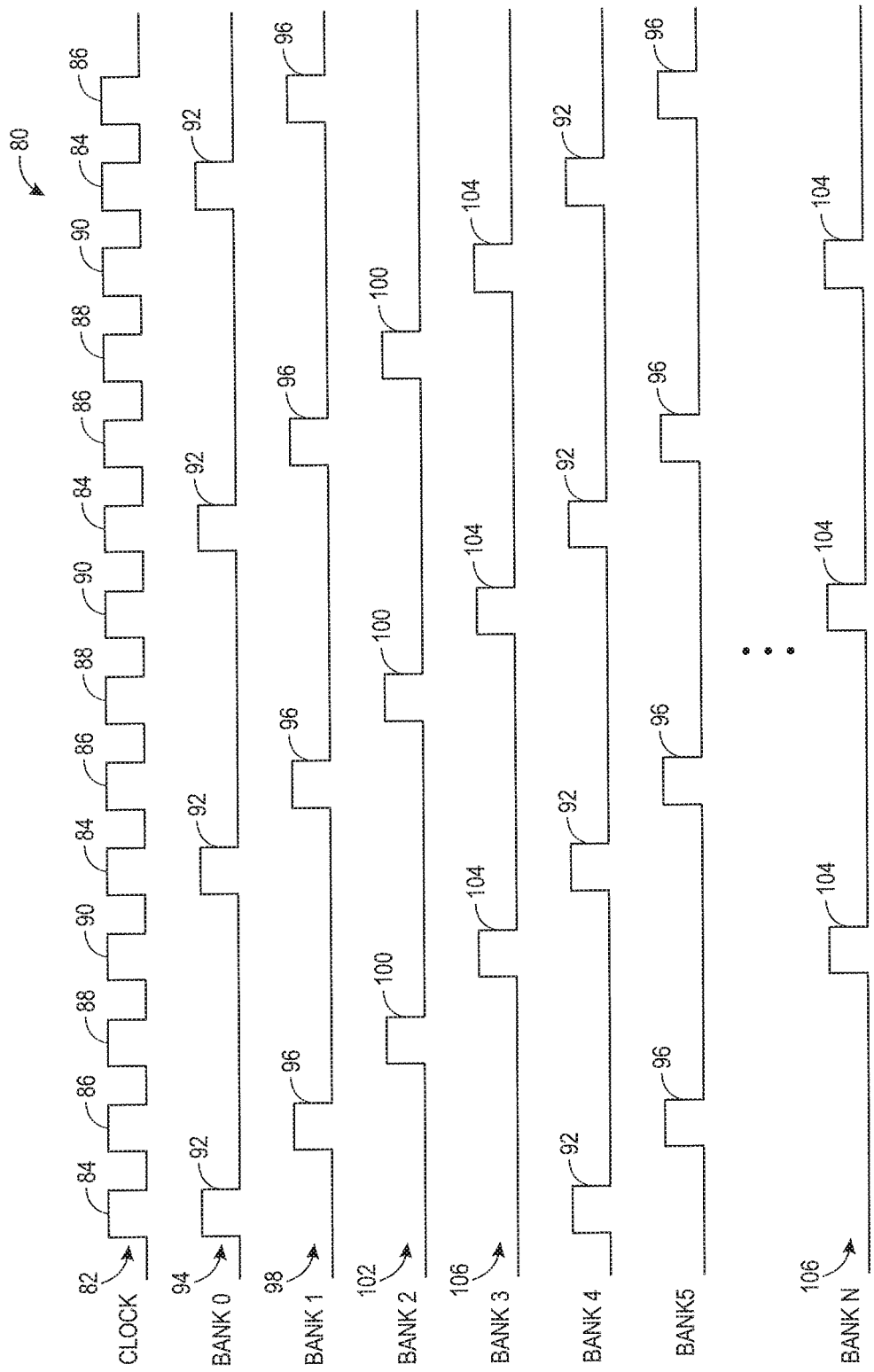
FIG. 4 is a timing diagram of the memory circuitry of FIG. 1 with refreshes of the memory banks within four refresh periods, in accordance with an embodiment.

Additional groups may be used for the memory refresh cycles. For example, four groups of memory bank refreshes may be employed to refresh the memory banks and further reduce memory refresh peak current demand. FIG. 4 illustrates a timing diagram 80. The timing diagram 80 includes a clock 82 that may be used as an oscillator that sequentially causes the memory banks to refresh through groups of four memory banks. The clock 82 includes sequential pulses 84, 86, 88, and 90, where the pulses 84 cause refreshes in a first group/set in the memory banks, the pulses 86 cause refreshes in a second group/set in the memory banks, the pulses 88 cause refreshes in a third group/set in the memory banks, and the pulses 90 cause refreshes in a fourth group/set in the memory banks. In some embodiments, the clock 82 may be faster than the clock 52 used for simultaneous refreshes and the clock 62 used for alternating refreshes to ensure that each memory bank is still updated frequently enough despite skipping more memory refresh cycles. For instance, the clock 52 may be set at a speed to ensure that each memory bank of the memory banks is updated before the capacitors of the memory bank leak enough charge that logic high values may be not interpreted correctly. In one embodiment, the clock 82 may have a higher (e.g., quadruple) frequency than the clock 52 used for simultaneous refreshes (e.g., double the frequency of the clock 62) since each memory bank experiences a refresh on every fourth refresh cycle instead of each refresh cycle to ensure that the refresh rate for each memory bank is maintained despite the quadruple refresh pattern.

Similar to the clock 62, each pulse of the clock 82 causes a corresponding memory bank group to self-refresh. When one of the first sets of the pulses 84 occur on the clock 82, corresponding memory refreshes 92 occur for a first subset of the memory banks corresponding to lines 94. Similarly, when one of the second sets of the pulses 86 occur on the clock 82, corresponding memory refreshes 96 occur for a second subset of the memory banks corresponding to lines 98. Likewise, when one of the third sets of the pulses 88 occur on the clock 82, corresponding memory refreshes 100 occur for a third subset of the memory banks corresponding to line 102. Further, when one of the fourth sets of the pulses 90 occur on the clock 82, corresponding memory refreshes 104 occur for a fourth subset of the memory banks corresponding to lines 106. In the illustrated embodiment, each of the memory refreshes occur simultaneously or substantially simultaneously (with a small 4-8 ns stagger).

Figure 5:
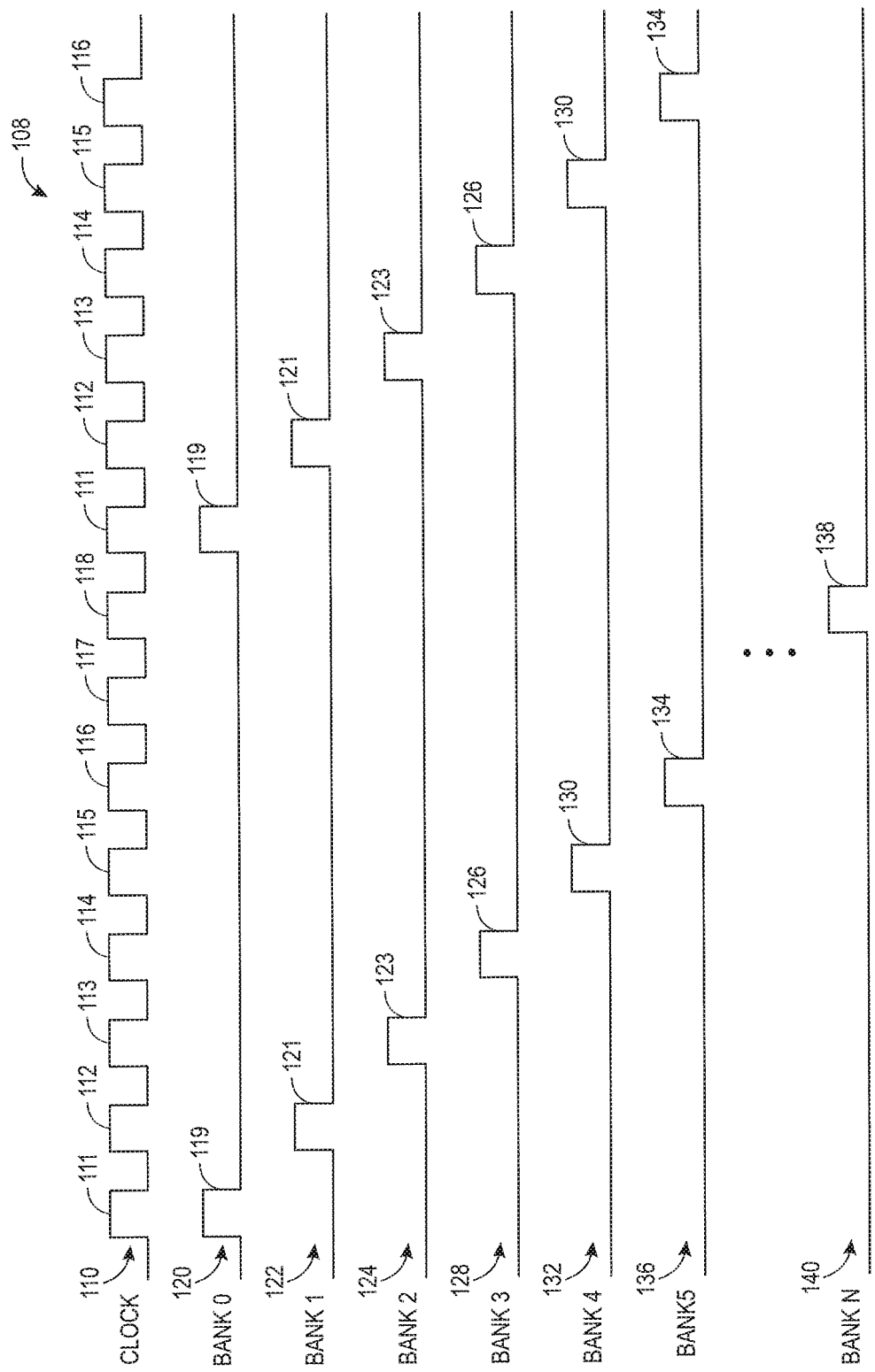
FIG. 5 is a timing diagram of the memory circuitry of FIG. 1 with refreshes of the memory banks within eight refresh periods.

FIG. 5 illustrates a timing diagram 108 with the memory banks divided into eight memory bank groups/sets for sequential refreshes through eight different memory refresh cycles. Thus, the timing diagram 108 sequentially outputs pulses 111, 112, 113, 114, 115, 116, 117, and 118 in pulse sets where each pulse sets causes a corresponding memory bank to refresh.

In some embodiments, the clock 110 may be faster than the clocks 52, 62, and 82. For instance, as previously noted, the clock 52 may be set at a speed to ensure that each memory bank of each memory bank is updated before the capacitors of the memory bank leak enough charge that logic high values may be not interpreted correctly. In one embodiment, the clock 110 may have a higher (e.g., octuple) frequency than the clock 52 used for simultaneous refreshes (e.g., quadruple the frequency of the clock 62 and double the frequency of the clock 82) since each memory bank experiences a refresh on every eighth refresh cycle instead of each refresh cycle to ensure that the refresh rate for each memory bank is maintained despite the octuple refresh pattern.

Similar to the clock 52, 62, and 82, each pulse of the clock 110 causes a corresponding memory bank group to self-refresh. When one of the first sets of the pulses 111 occur on the clock 110, corresponding memory refreshes 119 occur for a first subset of the memory banks corresponding to line 120. Similarly, when one of the second sets of the pulses 112 occur on the clock 110, corresponding memory refreshes 121 occur for a second subset of the memory banks corresponding to line 122. Likewise, when one of the third sets of the pulses 113 occur on the clock 110, corresponding memory refreshes 123 occur for a third subset of the memory banks corresponding to line 124. Further, when one of the fourth sets of the pulses 114 occur on the clock 110, corresponding memory refreshes 126 occur for a fourth subset of the memory banks corresponding to line 128. Also, when one of the fifth sets of the pulses 115 occur on the clock 110, corresponding memory refreshes 130 occur for a fifth subset of the memory banks corresponding to line 132. Additionally, when one of the sixth sets of the pulses 116 occur on the clock 110, corresponding memory refreshes 134 occur for a sixth subset of the memory banks corresponding to line 136. Similarly, the pulses 117 and 118 may cause bank refreshes in corresponding memory bank/bank groups. For instance, when one of the eighth sets of the pulses 118 occur on the clock 110, corresponding memory refreshes 138 occur for an eighth subset of the memory banks corresponding to line 140. In the illustrated embodiment, each of the memory refreshes occur simultaneously or substantially simultaneously (with a small 4-8 ns stagger).

Regardless of which of the previous refresh patterns are used, each stacked die may be programmed with its (group) number and uses the proper signal to determine when to self-refresh.

Although the foregoing contemplates memory bank grouping including organization into a group by a modulo operation (i.e., selecting every $i^{th}$ memory bank for a group), the groups may be selected and organized in any suitable manner. For example, the groups of memory banks may be physically adjacent to each other in the memory device 10.

Figure 6:
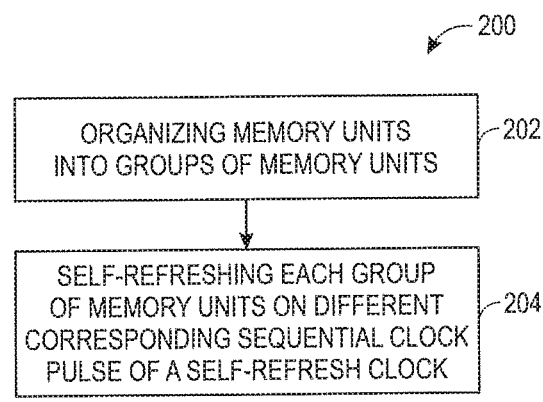
FIG. 6 is a flow diagram of a process for refreshing memory banks of the memory device of FIG. 1 across multiple refresh periods, in accordance with an embodiment.

FIG. 6 illustrates a flow diagram of a process 200 used to self-refresh memory units of the memory device 10. For example, the process 200 may be applied to obtain the timing diagrams 50, 60, 80, and 108. The process 200 includes organizing or grouping the memory units (e.g., banks 12, 14, and 16 or one or more die on which the banks are located) into groups of memory banks (block 202). For instance, the memory units of the memory device 10 may be grouped into a number of different groups where each group of memory units is self-refreshed in a single refresh cycle/period. In other words, each group of memory units is self-refreshed on different corresponding sequential clock pulses of a self-refresh clock (block 204). In some embodiments, one or more memory units (e.g., controller in the respective memory die) for each group counts a number of pulses of the self-refresh clock. A number of pulses corresponding to the respective group causes the memory unit to self-refresh. In some embodiments, each memory unit in each group counts the pulses. In other embodiments, one memory unit (e.g., a master die) acts as a master device for the group. For instance, the memory unit may count pulses. Upon counting a number of pulses corresponding to the group, the memory unit refreshes its own bank of capacitors by reading the data in the capacitors and rewriting the data to the capacitors. In addition to rewriting its own banks, the master memory unit sends an indication of the count as an indication that the group is to be refreshed. In response to receiving the indication, the slave memory unit refresh their own banks.

Although the foregoing discusses various logic-low and/or logic-high assertion polarities, at least some of these polarities may be inverted in some embodiments. Furthermore, in some embodiments, logic gates as discussed herein may be replaced with similar logical functions, such as an inverter replaced with a single NAND gate or other similar changes.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A memory device, comprising:
a memory controller comprising a self-refresh clock; and
a plurality of memory banks, wherein each memory bank in a first subset of the plurality of memory banks is configured to self-refresh during a first self-refresh cycle indicated by a first pulse of the self-refresh clock, and each memory bank in a second subset of the plurality of memory banks is configured to self-refresh during a second self-refresh cycle indicated by a second pulse of the self-refresh clock, wherein a first memory bank in the first subset is configured to count pulses of the self-refresh clock and to self-refresh itself in response to a first number of counted pulses of the self-refresh clock, and a second memory bank in the second subset is configured to count pulses of the self-refresh clock and to self-refresh itself in response to a second number of counted pulses of the self-refresh clock.

2. The memory device of claim 1, wherein at least one memory bank in each subset of the memory banks of a plurality of subsets of the memory banks is configured to:
  count pulses of the self-refresh clock; and
  self-refresh the at least one memory bank after an ith pulse and each Nth pulse subsequent to the ith pulse, wherein i is the number corresponding to the respective subset for the respective at least one memory bank and N is the total number of subsets of memory banks.

3. The memory device of claim 1, wherein each memory bank in a third subset of the plurality of memory banks is configured to self-refresh during a third self-refresh cycle indicated by a third pulse of the self-refresh clock, and each memory bank in a fourth subset of the plurality of memory banks is configured to self-refresh during a fourth self-refresh cycle indicated by a fourth pulse of the self-refresh clock.

4. The memory device of claim 3, wherein:
  each memory bank in a fifth subset of the plurality of memory banks is configured to self-refresh during a fifth self-refresh cycle indicated by a fifth pulse of the self-refresh clock;
  each memory bank in a sixth subset of the plurality of memory banks is configured to self-refresh during a sixth self-refresh cycle indicated by a sixth pulse of the self-refresh clock;
  each memory bank in a seventh subset of the plurality of memory banks is configured to self-refresh during a seventh self-refresh cycle indicated by a seventh pulse of the self-refresh clock; and
  each memory bank in an eighth subset of the plurality of memory banks is configured to self-refresh during an eighth self-refresh cycle indicated by an eighth pulse of the self-refresh clock.

5. The memory device of claim 1, wherein a frequency of the self-refresh clock is N times a frequency that has a wavelength shorter than a maximum refresh duration for any individual memory bank of the plurality of memory banks where N is a number of different subsets with different self-refresh cycles in the plurality of memory banks.

6. The memory device of claim 1, wherein each memory bank comprises a plurality of capacitors, wherein the self-refresh clock is configured to cause the capacitors of the plurality of capacitors to self-refresh before stored charges in the capacitors is lost due to charge leakage of the capacitors.

7. The memory device of claim 6, wherein the self-refresh comprises:
  reading data from the plurality of capacitors; and
  writing back the data to the plurality of capacitors.

8. The memory device of claim 1, wherein the self-refresh is completed without direction from a host device coupled to the memory device.

9. The memory device of claim 1, wherein self-refreshes of each memory bank in the first subset of the plurality of memory banks occur simultaneously.

10. The memory device of claim 1, wherein self-refreshes of each memory bank in the first subset of the plurality of memory banks occur within 4-8 ns of each other.

11. A method comprising:
  assigning memory banks of a memory device into one of a number of groups; and
  self-refreshing each group of memory banks on different corresponding sequential clock pulses of a self-refresh clock, wherein separately refreshing each group comprises at least one memory bank in each memory group configured to count pulses of the self-refresh clock and to self-refresh itself in response to a counted number of pulses of the self-refresh clock.

12. The method of claim 11, wherein self-refreshing each group of the memory banks comprises:
  counting pulses of the self-refresh clock in the respective group; and
  after an ith pulse and after each N pulses after the ith pulse, refreshing the respective group, wherein i is the number of the respective group and N is the total number of subsets of memory banks.

13. The method of claim 11, wherein a frequency of the self-refresh clock is equal to a refresh rate of any memory bank of the memory banks times the number.

14. The method of claim 11, wherein self-refreshing a group of memory banks comprises self-refreshing each memory bank of a respective memory bank simultaneously.

15. The method of claim 11, wherein self-refreshing a group of memory banks comprises self-refreshing each memory bank of a respective memory bank with a 4-8 ns stagger between each self-refresh.

16. The method of claim 11, wherein the at least one memory bank is a master for a respective memory bank group and is configured to send an indication to other memory banks in the respective memory bank group to cause the other memory banks to self-refresh.

17. A memory device, comprising:
  a memory controller configured to output a self-refresh clock; and
  a plurality of memory banks configured to:
    receive the self-refresh clock; and
    sequentially refresh groups of the plurality of memory banks using sequential pulses of the self-refresh clock, wherein each pulse of the self-refresh clock induces a self-refresh cycle that causes refresh in a group of the refresh groups, wherein a first memory bank corresponding to a first refresh group is configured to:
      count pulses of the self-refresh clock; and
      after a number corresponding to the first refresh group has been counted, refresh the first refresh group.

18. The memory device of claim 17, wherein sequentially and separately refreshing groups of the plurality of memory banks comprises refreshing memory banks of a respective group by staggering refreshing of the memory banks of the respective group within a single refresh cycle.

19. The memory device of claim 17, wherein the first memory banks is configured to send an indication of the count of the number to a second memory bank corresponding to the first refresh group, and the second memory bank is configured to:
  receive the indication of the count of the number from the first memory bank; and
  in response to receiving the indication, refresh the second memory bank.

20. The memory device of claim 17, wherein the first memory bank is configured to refresh the first refresh group for every Nth pulse of the self-refresh clock that occur after the number has been counted.

* * * * *